United States Patent
Akiyama et al.

(10) Patent No.: US 8,765,576 B2
(45) Date of Patent: Jul. 1, 2014

(54) PROCESS FOR PRODUCING LAMINATED SUBSTRATE AND LAMINATED SUBSTRATE

(75) Inventors: Shoji Akiyama, Gunma (JP); Atsuo Ito, Gunma (JP); Yoshihiro Kubota, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 867 days.

(21) Appl. No.: 12/550,340

(22) Filed: Aug. 28, 2009

(65) Prior Publication Data

US 2010/0084746 A1    Apr. 8, 2010

Related U.S. Application Data

(63) Continuation of application No. PCT/JP2007/053839, filed on Feb. 28, 2007.

(51) Int. Cl.
*H01L 21/30* (2006.01)
*H01L 21/762* (2006.01)
*H01L 21/3105* (2006.01)

(52) U.S. Cl.
CPC .... *H01L 21/76254* (2013.01); *H01L 21/76251* (2013.01); *H01L 21/31051* (2013.01)
USPC .... 438/455; 438/458; 438/459; 257/E21.567; 257/E21.568

(58) Field of Classification Search
USPC .......... 438/455, 456, 458, 459; 257/E21.568, 257/E21.567
See application file for complete search history.

(56) References Cited

U.S. PATENT DOCUMENTS

| | | | |
|---|---|---|---|
| 7,198,671 B2 * | 4/2007 | Ueda | 117/84 |
| 2003/0089950 A1 | 5/2003 | Kuech et al. | |
| 2004/0126993 A1 * | 7/2004 | Chan et al. | 438/455 |
| 2004/0178448 A1 | 9/2004 | Rayssac et al. | |
| 2005/0064632 A1 | 3/2005 | Sakurada et al. | |
| 2005/0118789 A1 * | 6/2005 | Aga et al. | 438/459 |
| 2005/0269671 A1 * | 12/2005 | Faure et al. | 257/618 |
| 2006/0154445 A1 | 7/2006 | Iwabuchi | |
| 2006/0255341 A1 | 11/2006 | Pinnington et al. | |
| 2007/0170503 A1 * | 7/2007 | Allibert et al. | 257/347 |

FOREIGN PATENT DOCUMENTS

| | | |
|---|---|---|
| EP | 0 954 014 A1 | 11/1999 |
| EP | 1 583 145 A1 | 10/2005 |
| JP | 10-83962 A | 3/1998 |
| JP | 2000-36445 A | 2/2000 |

(Continued)

OTHER PUBLICATIONS

International Search Report (ISR) for PCT/JP2007/053839, mailed May 29, 2007.
Written Option (PCT/ISA/237) of PCT/JP2007/053839, mailed date May 29, 2007.

(Continued)

*Primary Examiner* — Michael Trinh

(57) ABSTRACT

A method of manufacturing a laminated substrate is provided. The method includes: forming an oxide film on at least a surface of a first substrate having a hardness of equal to or more than 150 GPa in Young's modulus, and then smoothing the oxide film; implanting hydrogen ions or rare gas ions, or mixed gas ions thereof from a surface of a second substrate to form an ion-implanted layer inside the substrate, laminating the first substrate and the second substrate through at least the oxide film, and then detaching the second substrate in the ion-implanted layer to form a laminated substrate; heat-treating the laminated substrate and diffusing outwardly the oxide film.

16 Claims, 1 Drawing Sheet

(56) References Cited

FOREIGN PATENT DOCUMENTS

| | | |
|---|---|---|
| JP | 2002-164520 A | 6/2002 |
| JP | 2003-66427 A | 3/2003 |
| JP | 2003-282845 A | 10/2003 |
| JP | 2004-55752 A | 2/2004 |
| JP | 2004-87768 A | 3/2004 |
| JP | 2004-221198 A | 8/2004 |
| JP | 2005-85964 A | 3/2005 |
| JP | WO2005-024918 A1 | 3/2005 |
| JP | 2006-505122 A | 2/2006 |
| JP | 2006-517734 A | 7/2006 |
| JP | 2006-295037 A | 10/2006 |
| JP | 2007-227415 A | 9/2007 |
| KR | 10-2004-0029292 A | 4/2004 |
| WO | 03/019189 A1 | 3/2003 |
| WO | 2004/075287 A1 | 9/2004 |
| WO | 2005/124865 A1 | 12/2005 |

OTHER PUBLICATIONS

European Search Report dated Feb. 10, 2012, in a counterpart European patent application No. 07 737 557.4.
European Search Report dated Jun. 6, 2011, in a counterpart European patent application No. 07737557.4.
Office action issued by the Korean Intellectual Property Office for application No. 10-2009-7018013, dated Apr. 19, 2013.
Japanese Office Action dated Nov. 6 2012, in a counterpart Japanese patent application No. 2006-043281. (A machine translation (not reviewed for accuracy) attached.).
Appeal Pre-Report for Japanese Patent Application No. 2006-043281, issued by the Japanese Patent Office on Jul. 30, 2013.
Communication Pursuant to Article 94(3) EPC for Application No. 07 737 557.4, issued by the European Patent Office on Jan. 2, 2014.
Office Action for Japanese Patent Application No. 2006-43281, issued by the Japanese Patent Office on Oct. 8, 2013.
Decision of Rejection of Japanese Patent Application No. 2006-43281, issued by the Japanese Patent Office on Mar. 4, 2014.

\* cited by examiner

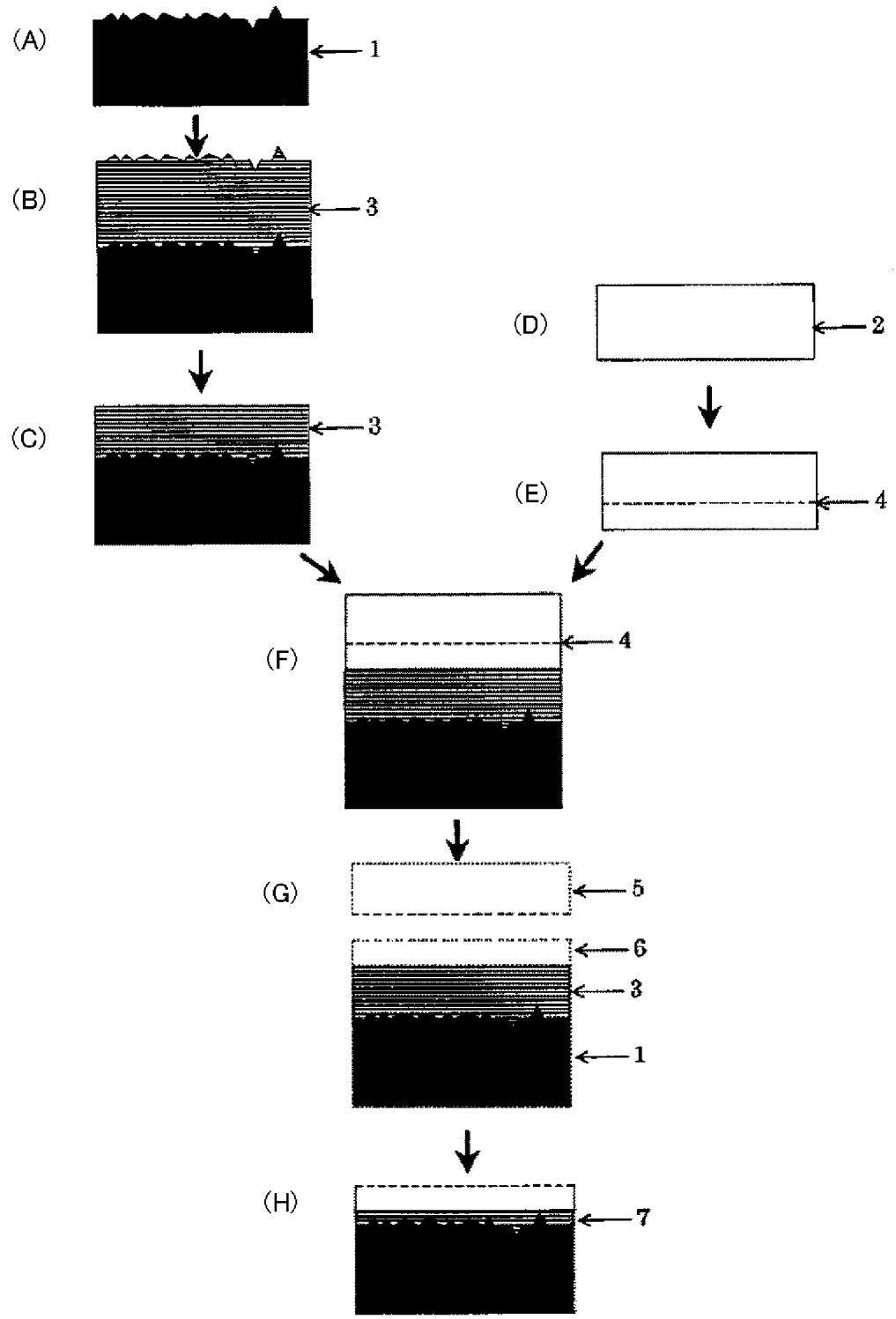

PROCESS FOR PRODUCING LAMINATED SUBSTRATE AND LAMINATED SUBSTRATE

CROSS REFERENCE TO RELATED APPLICATION

This is a continuation application of PCT/JP2007/053839 filed on Feb. 28, 2007, the contents of which are incorporated herein by reference.

BACKGROUND

1. Technical Field

The present invention relates to a method of manufacturing a laminated substrate, and a laminated substrate. More specifically, the present invention relates to a method of manufacturing a laminated substrate, and a laminated substrate using high-hardness substrates having a hardness of equal to or more than 150 GPa in Young's modulus. In the designated countries where incorporation of documents by reference is approved, the content described in the specification of the following patent application is incorporated into the present patent application by reference, and will be regarded as a part described in the present specification. Japanese Patent Application No. 2006-043281 Date of filing: Feb. 21, 2006

2. Related Art

In recent years, a SOI substrate in which a semiconductor thin film typified by silicon is formed on an insulating material is increasingly used as a substrate for an energy saving device. The SOI substrate is typically formed by depositing a silicon support (handle) substrate, forming a silicon oxide film thereon, and forming a silicon thin film thereon as a top layer.

Meanwhile, some special SOI substrates may use a clear substrate such as sapphire as the handle substrate in order to be used for a high-frequency device. The reason is that the clear substrate as the handle substrate has a high transparency, a high heat conductivity and a low dielectric constant. Such substrate is referred to as Silicon on Sapphire: SOS, in which the silicon layer typically heteroepitaxially grows on the sapphire (e.g. see Patent Document 1). As a result, the silicon layer has many defects while growing due to difference of the lattice constant between silicon and sapphire.

A laminating method may be applied to the method for manufacturing such SOS. However, lamination requires a significantly high flatness (equal to or less than 0.5 nm rms). Therefore, when a hard material such as sapphire is used, the laminated interface has void defect since roughness and scratch remain on the surface after polishing.

Not only when sapphire is used, but also when other hard materials such as SiC (Young's modulus=about 250 GPa) and AlN (Young's modulus=about 300 GPa) are used, it is difficult to achieve a high flatness due to it's hardness, consequently, such hard materials are not suitable for lamination.

As described above, although the high-hardness substrates made of sapphire and SiC etc. have excellent characteristics such as heat-releasing characteristic and insulating characteristic, it is difficult to achieve a high flatness due to it's hardness, consequently, it is difficult to achieve a laminated substrate having a small defect density.

Accordingly, a method for manufacturing a laminated substrate has been required, which uses a high-hardness substrate for lamination to provide a substrate having a small defect density.

Patent Document 1: Japanese Patent Application Publication No. 10-83962

In view of the above described problems, the present invention is to provide a method of manufacturing a laminated substrate that provides a laminated substrate having a small defect density by using high-hardness substrates for lamination.

SUMMARY

In order to solve the problems, the present invention provide a method of manufacturing a laminated substrate. The method includes the steps of: forming an oxide film on a surface of a first substrate having a hardness of at least equal to or more than 150 GPa in Young's modulus and then smoothing the oxide film; implanting hydrogen ions or rare gas ions, or mixed gas ions thereof from a surface of a second substrate to form an ion-implanted layer inside the substrate, laminating the first substrate and the second substrate through at least the oxide film, and then detaching the second substrate in the ion-implanted layer to form a laminated substrate, heat-treating the laminated substrate and diffusing outwardly the oxide film (Claim 1).

Even if the high-hardness substrates are used, such method may facilitate to smooth the surfaces to be laminated by smoothing the oxide films which are formed on the surfaces of the substrates, so that the laminated substrate can be manufactured by using the high-hardness substrates. Consequently, the laminated substrate having a small defect density by using the high-hardness substrates for lamination.

Here, as the first substrate, any of sapphire, SiC and alumina is used (Claim 2).

In this manner, any of sapphire, SiC, and alumina is used for the first substrate, so that the laminated substrate having excellent heat-releasing characteristic and insulating characteristic may be manufactured.

Moreover, as the second substrate, any of silicon, SiC, gallium nitride, SiGe and germanium is used (Claim 3).

In this manner, any of silicon, SiC, gallium nitride, SiGe, and germanium may be used as the second substrate to manufacture the laminated substrate.

In addition, the smoothing the oxide film includes mechanically and chemically polishing a surface of the oxide film. It is preferred that a surface roughness of the oxide film is equal to or less than 0.5 nm rms (Claim 4).

In this manner, the surface of the oxide film is mechanically and chemically polished to smooth the oxide film and the surface roughness is made equal to or less than 0.5 nm rms, so that the oxide film to be a laminated surface is highly smoothed.

Thereby an excellent lamination is obtained, therefore any defect such as void does not likely occur, and it is not possible to detach the first substrate and the second substrate during the manufacturing process of the device.

Moreover, before the laminating the first substrate and the second substrate, it is preferred that plasma processing or ozone processing is performed on the surface to be laminated of at least one of the first substrate and the second substrate (Claim 5).

In this manner, the surfaces of the substrates are subjected to plasma processing or ozone processing, so that Hydroxy group is increased on the surfaces of the substrates to activate the substrates. Then, the activated surfaces of the substrates are used as the surfaces to be laminated, so that the laminated surfaces are securely bonded by hydrogen bond.

Consequently, the laminated surfaces are securely bonded without a heat treatment at a high temperature in order to increase the bonding strength. In addition, since the bonded surfaces are securely bonded each other, detachment in the ion-implanted layer may be performed by applying mechanical impacts.

Moreover, the detaching in the ion-implanted layer is performed by applying mechanical impacts (Claim 6).

In this manner, the detaching in the ion-implanted layer is performed by applying a mechanical impact, so that the laminated substrate may be thinned without performing any heat treatment for detachment. Consequently, the laminated substrate can be manufactured without generating thermal strain, detachment, crack, and so forth which are caused by the difference between the heat expansion coefficients of the first substrate and the second substrate.

Moreover, when the second substrate has the hardness of equal to or more than 150 GPa in Young's modulus, the method further comprising: forming the oxide film on the surface of the second substrate, and then smoothing the oxide film, wherein the laminating the first substrate and the second substrate includes laminating the surface of the first substrate and the surface of the second substrate, each surface to be laminated has a smoothed oxide film formed thereon (Claim 7).

In this manner, when the second substrate also has the hardness of equal to or more than 150 GPa in Young's modulus, the step of forming the oxide film and then smoothing the oxide film are performed on the second substrate as well as the first substrate, so that the high-hardness substrates are easily laminated each other to provide the laminated substrate.

Moreover, the present invention provides a laminated substrate which is manufactured by any of the above described methods (Claim 8).

As described above, provided that the laminated substrate is manufactured by any of the above described methods, the laminated substrate has excellent characteristics such as excellent heat-releasing characteristic and insulating characteristic due to the high-hardness substrates, and also has a small defect density.

Moreover, the present invention provides a laminated substrate, comprising: a first substrate made of any of sapphire, SiC and alumina; and a second substrate made of any of silicon, SiC, gallium nitride, SiGe and germanium, wherein the first substrate and the second substrate are laminated through oxide films having polished surfaces (Claim 9).

The laminated substrate with such high-hardness substrates is excellent in heat-releasing characteristic and insulating characteristic, and has a small defect density.

The summary clause does not necessarily describe all necessary features of the embodiments of the present invention. The present invention may also be a sub-combination of the features described above.

As described above, by using the method of manufacturing a laminated substrate according to the present invention, high-hardness substrates such as sapphire, SiC and alumina, of which surfaces are hard to be smoothed can be easily laminated each other, or the high-hardness substrate and a semiconductor substrate such as Si, GaN and so forth can be easily laminated to provide a laminated substrate. Such laminated substrate is excellent in heat-releasing characteristic and insulating characteristic, and has a small defect density.

BRIEF DESCRIPTION OF THE DRAWINGS

FIG. 1 is a process drawing showing an exemplary manufacturing method of a laminated substrate according to the present invention.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

As described above, conventionally, a high-hardness substrate is hard to have a high flatness required for lamination. In addition, a high-hardness substrates is not suitable for a laminated substrate although it is excellent in heat-releasing characteristic and insulating characteristic.

Therefore, the inventors eagerly studied, and then came up with the following steps, i.e. forming oxide films on the surfaces of high-hardness substrates and then smoothing the oxide films; and laminating the oxide films each other, thereby a laminated substrate using high-hardness substrates can be easily obtained.

In this manner, the inventors completed the present invention.

Now embodiments of the present invention will be described in detail, although the invention is not limited in this regard.

FIG. 1 is a process drawing showing an exemplary manufacturing method of a laminated substrate according to the present invention.

Firstly, a first substrate 1 having a hardness of equal to or more than 150 GPa in Young's modulus is prepared as shown in FIG. 1(A).

Such high-hardness substrate is harder than silicon single crystal (130 GPa) and quartz (66 GPa), and tends to occur a lamination defect. For example, any of sapphire, SiC and alumina may be used for the first substrate provided that it satisfies the above described hardness condition, although the invention is not limited in this regard. The upper limit of Young's modulus for the first substrate is not particularly limited, however, the hardness of diamond is 1000 GPa in Young's modulus and that value is the upper limit. The hardness of SiC is 250 GPa and that of AlN is 300 GPa, dependent on crystal form.

Moreover, the first substrate is mechanically polished to make the surface roughness of such as equal to or less than 10 nm rms (measured by AFM at 10μ), so that the thickness of the oxide film required to compensate roughness of the first substrate more reduces.

As a result, eventually a laminated substrate having a thinner oxide film on the first substrate can be provided.

Next, an oxide film 3 is formed on the surface of the first substrate as shown in FIG. 1 (B).

The oxide film 3 may be formed by depositing an oxide film by CVD or PVD, for example. Alternatively, the oxide film may be formed on the surface of the first substrate by an oxidation treatment with thermal oxidation. As for materials of the oxide film, the oxide of the substrate material may be selected. However, when the oxide film is formed by deposition, any oxide different from the oxide of the substrate material may be selected. The selection may be made appropriately in accordance with the purpose. For example, $SiO_2$, $Al_2O_3$, $GeO_2$ and so forth may be selected.

Moreover, the oxide film may be biscuit-fired at a temperature equal to or more than 700 degrees Celsius if necessary.

Next, the oxide film 3 is smoothed as shown in FIG. 1(C).

Although the smoothing method is not limited, the film may be smoothed by mechanically and chemically polishing. At this time, it is preferred that the surface of the oxide film is mechanically and chemically polished to make the surface roughness of the oxide film be equal to or less than 0.5 nm, in order to manufacture a laminated substrate in which the laminated surfaces are not hard to separate from each other. In addition, the technique for mechanically and chemically polishing the oxide film has been matured enough to easily obtain the roughness of equal to or less than 0.5 nm rms. Here, it is preferred that the thickness of the oxide film after being smoothed is equal to or less than 60 nm in order to reduce the time period for heat treating and outwardly spreading the oxide film in the following process.

Next, a second substrate 2 is prepared as shown FIG. 1(D).

The material for the second substrate may be selected among such as silicon, SiC, gallium nitride, SiGe or germanium, although the invention is not limited in this regard. The so-called SOI substrate may be manufactured by using silicon, while the so-called SGOI substrate by using SiGe, which recently attracts attention in view of its high-speed operating characteristic.

When the second substrate has the hardness of equal to or more than 150 GPa in Young's modulus as well as the substrate 1, the following step may be performed: forming the oxide film on the surface of the second substrate, and then smoothing the oxide film. Here, it is preferred that the laminating the first substrate and the second substrate includes laminating the surface of the first substrate and the surface of the second substrate, and each surface to be laminated has a smoothed oxide film formed thereon.

In this manner, the high-hardness substrates having the hardness of equal to or more than 150 GPa in Young's modulus can be easily laminated each other.

Next, the surface of the second substrate 2 is implanted with hydrogen ions or rare gas ions, or the mixed gas ions thereof to form an ion-implanted layer 4 inside the substrate as shown in FIG. 1 (E).

For example, when the second substrate is implanted with a predetermined dose of hydrogen ions or rare gas ions, or the mixed gas ions thereof, the temperature of the second substrate is set to 250 to 450 degrees Celsius and the implantation is performed by such energy that the ion-implanted layer is formed at a depth of such as equal to or less than 0.5 μm corresponding to the desired thickness of the semiconductor layer from the surface of the second substrate. At this time, the implantation energy may be 20 to 100 KeV and the dose may be $1 \times 10^{16}$ to $1 \times 10^{17}$ atoms/cm$^2$, for example. Here, it is preferred that the ion dose is more than $8 \times 10^{16}$ atoms/cm$^2$ in order to facilitate to detach the lamination in the ion-implanted layer.

In addition, an insulating film such as a thin silicon oxide is previously formed on the surface of the second substrate, and then the substrate is implanted with the ions through the insulating film, so that the channelling effect of implanted ions may be reduced.

Next, the first substrate and the second substrate are laminated through at least the oxide film on the first substrate as shown in FIG. 1 (F).

Here, it is preferred that the laminated surface of at least one of the first substrate and the second substrate is subjected to plasma processing or ozone processing before the first substrate and the second substrate are laminated.

When the plasma processing is employed, the plasma processing on the surface is performed by the following steps: 1) the first substrate and/or second substrate is cleaned (e.g. RCA cleaning) and placed in a vacuum chamber; 2) plasma gas is introduced into the vacuum chamber; and 3) the first substrate and/or second substrate are exposed to high-frequency plasma about 100 W for about 5 to 10 seconds. Such as hydrogen gas, argon gas, or the combination thereof, or the combination of hydrogen gas and helium gas, or oxygen gas may be used for the plasma gas.

Meanwhile, when the ozone processing is employed, the ozone processing on the surface is performed by the following steps: 1) the first substrate and/or second substrate is cleaned (e.g. RCA cleaning) and placed in a chamber into which the atmosphere is introduced; 2) plasma gas such as nitrogen gas and argon gas is introduced into the chamber; and 3) high-frequency plasma is generated to convert oxygen in the atmosphere into ozone.

Either the plasma processing or the ozone processing, or both the plasma processing and the plasma processing may be selected.

In this manner, the plasma processing or the ozone processing is performed, so that organic substance on the laminated surface of the first substrate and/or the second substrate is oxidized and removed, and hydroxy group on the surface increases to activate the surface. In this manner, when such activated surfaces of the substrate are used as surfaces to be laminated, the laminated surfaces are firmly bonded due to hydrogen bonding, so that a desired sufficient bond is achieved without any post-high-heat treatment for further bounding strength.

Although it is preferred that plasma processing or ozone processing is performed on both the first substrate and the second substrate, the treatment may be performed on either substrate.

When the first substrate and the second substrate are laminated through the oxide film of at least the first substrate, the condition of lamination is not limited. For example, when the surface to be laminated of at least one of the first substrate and the second substrate is subjected to plasma processing or ozone processing as described above, the laminated surfaces are bonded strongly enough to bear a mechanical detachment in a subsequent step only by adhering the substrates to each other under a reduced pressure or normal pressure and at a temperature such as the general room temperature. Accordingly, heat treatment for bonding at a high temperature of equal to or more than 1200 degrees Celsius is not required, so that preferably, heat distortion, crack, detachment and so forth are not likely to occur, which are caused by the difference of heat expansion coefficients between two substrates due to heating.

Here, after lamination, the bonded substrates may be subjected to heat treatment at a low temperature of less than 400 degrees Celsius in order to increase the bonding strength.

Next, in the bonded substrates, a part 5 of the second substrate is detached in the ion-implanted layer, so that a laminated substrate composed of a semiconductor layer 6, an oxide film 3 and the first substrate 1 is obtained as shown in FIG. 1(G).

Although the process of detaching in the ion-implanted layer is not limited particularly, detachment may be performed by applying mechanical impacts, for example.

As described above, the mechanical detachment is performed by applying impacts on the ion-implanted layer, so that differently from heat detachment, heat distortion, crack, detachment from the laminated surface and so forth due to heat are not likely to occur.

In order to apply impacts on the ion-implanted layer, fluid jet such as gas and liquid may be continuously or intermittently sprayed on the side surface of the bonded substrates, although the invention is not limited in this regard as far as the mechanical detachment is generated by any impact.

Next, the laminated substrate obtained as described above is heat-treated, and the oxide film 3 is outwardly diffused as shown in FIG. 1(H).

In this case, it is preferred that the heat treatment is performed at a temperature of equal to or more than 900 degrees Celsius in the nonoxidative atmosphere, although the invention is not limited in this regard.

The thickness of the oxide film 7 after the heat treatment is preferably equal to or less than 60 nm, more preferably equal to or less than 50 nm, further preferably equal to or less than 30 nm.

As described above, the oxide film is removed as for as possible, except for the minimum oxide film 7 required to compensate the roughness of the high-hardness substrates, so that the laminated substrate which minimizes the effect of the oxide film on the characteristics such as heat-releasing characteristic and so forth can be obtained. In this case, since the thickness of the semiconductor layer 6 has been reduced, such as crack due to the difference of the heat expansion coefficient from that of the first substrate even if the heat treatment is performed.

Then, the laminated substrate manufactured by the above described processes (A) to (H) is a laminated substrate using the high-hardness substrates.

In addition, the laminated substrate is formed by laminating the first substrate made of such as sapphire, SiC or alumina and the second substrate made of such as silicon, SiC, gallium nitride, SiGe or germanium through the oxide film having the polished surface.

Moreover, the laminated substrate has excellent characteristics, such as high heat-releasing characteristic and insulating characteristic due to the high-hardness substrate, and its defect density is small.

Example

A sapphire substrate having the diameter of 200 mm (Young's modulus=approximately 363 GPa) was prepared as the first substrate 1 as shown in FIG. 1 (A). The first substrate 1 was mechanically polished, and the surface roughness was made equal to or less than 10 nm rms (measured by AFM at 10 μm).

Next, the oxide film $(SiO_2)_3$ having the thickness of 100 nm was deposited on the surface of the first substrate 1 by the CVD method as shown in FIG. 1(B).

Next, the oxide film 3 was smoothed by mechanically and chemically polishing, where the thickness of the oxide film is 40 nm and the surface roughness of the oxide film is 0.3 nm rms as shown in FIG. 1(C).

Meanwhile, a single crystal silicon substrate having the diameter of 200 mm was prepared as the second substrate 2 as shown in FIG. 1(D).

The second substrate 2 was implanted with hydrogen ions, and the ion-implanted layer 4 was formed in the substrate as shown in FIG. 1(E). The implantation was performed under the condition that the energy was 35 keV and the dose was $9 \times 10^{16}$ atoms/cm$^2$. The depth of implantation was 0.3 nm.

Next, the ion-implanted second substrate was placed in a plasma processing device and air is introduced as plasma gas. Then, a high-frequency plasma processing is performed for 5 to 10 seconds such that high-frequency of 13.56 MHz was applied between parallel plate electrodes having the diameter 300 mm at a high-frequency power of 50 W under the reduced pressure of 2 Torr (267 Pa).

Meanwhile, the first substrate was placed in the chamber into which the atmosphere was introduced, and argon gas, as plasma gas was introduced into the narrow space between the electrodes.

Then, high-frequency was applied between the electrodes to generate plasma.

The atmosphere was intervened between the plasma and the substrate to ozonize oxygen in the atmosphere, and then the laminated surface is processed by the ozone. The processing time was 5 to 10 seconds.

The first substrate and the second substrate having the surfaces which were processed as described above were adhered to each other at the room temperature, and then one end of both the wafers was pressed in the depthwise direction to start bonding as shown in FIG. 1(F). After leaving it for 48 hours at the room temperature, it was observed with eyes that the bonded surface spread over the substrate and the first substrate and the second substrate were bonded to each other. In order to check the bonding strength, an attempt to move laterally one substrate by applying stress on the surface of the substrate in parallel with the substrate was made while the other substrate is fixed, however the substrate was not moved.

Next, in order to detach the bonded surface by applying impacts on the ion-implanted layer 4, the side surface of the bonded substrate was wedged from opposite positions with blades of paper scissors several times. Consequently, detachment occurred in the ion-implanted layer, so that the laminated substrate composed of the semiconductor layer 6, the oxide film 3 and the first substrate 1 was obtained as shown in FIG. 1 (G).

Next, such laminated substrate was heat-treated and the oxide film 3 was outwardly diffused as shown in FIG. 1(H).

The heat treatment was performed under the argon gas atmosphere at equal to or more than 1000 degrees Celsius, and the thickness of the oxide film 7 after the heat treatment was made 20 nm.

For the semiconductor layer 6 of the resultant laminated substrate, SECCO defect evaluation using dilution liquid of SECCO etchant was performed according to the usual method. As a result, the defect density was $2 \times 10^3$ to $6 \times 10^3$/cm$^2$, so it was found that the defect density was small. Accordingly, it was found that the laminated substrate having the small defect density and using the high-hardness substrates can be obtained.

Here, the present invention is not confined to the above described embodiments, and the embodiments are only illustration. It is intended that any modifications or changes which have configuration and effect the substantially same as the technical idea set forth in the following claims may come within the scope of the present invention.

What is claimed is:

1. A method of manufacturing a laminated substrate, comprising:

forming an oxide film on at least a surface of a first substrate having a hardness of equal to or more than 150 GPa in Young's modulus;

smoothing the oxide film by mechanically and chemically polishing a surface of the oxide film such that a surface roughness of the oxide film is equal to or less than 0.5 nm rms;

implanting hydrogen ions or rare gas ions, or mixed gas ions thereof from a surface of a second substrate to form an ion-implanted layer inside the substrate;

laminating the first substrate and the second substrate through at least the oxide film, and then detaching the second substrate in the ion-implanted layer to form a laminated substrate; and heat-treating the laminated substrate and diffusing outwardly the oxide film, such that a thickness of the oxide film is reduced to a minimum thickness required to compensate for a roughness of the surface of the first substrate, such that the surface of the oxide film is at substantially the same elevation as the highest peak of the surface of the first substrate.

2. The method according to claim 1, wherein as the first substrate, any of sapphire, SiC and alumina is used.

3. The method according to claim 1, wherein as the second substrate, any of silicon, SiC, gallium nitride, SiGe and germanium is used.

4. The method according to claim 1, wherein before the laminating the first substrate and the second substrate, plasma processing or ozone processing is performed on the surface to be laminated of at least one of the first substrate and the second substrate.

5. The method according to claim 1,
wherein when the second substrate has the hardness of equal to or more than 150 GPa in Young's modulus, the method further comprising forming the oxide film on the surface of the second substrate, and then smoothing the oxide film,
wherein the laminating the first substrate and the second substrate includes laminating the surface of the first substrate and the surface of the second substrate, each surface to be laminated has a smoothed oxide film formed thereon.

6. The method of manufacturing a laminated substrate according to claim 1, wherein the diffusing outwardly the oxide film reduces a thickness of the oxide film to 60 nm or less.

7. A method of manufacturing a laminated substrate, comprising:
forming an oxide film on at least a surface of a first substrate having a hardness of equal to or more than 150 GPa in Young's modulus, and then smoothing the oxide film;
implanting hydrogen ions or rare gas ions, or mixed gas ions thereof from a surface of a second substrate to form an ion-implanted layer inside the substrate;
laminating the first substrate and the second substrate through at least the oxide film, and then detaching the second substrate in the ion-implanted layer by applying mechanical impacts to form a laminated substrate; and
heat-treating the laminated substrate and diffusing outwardly the oxide film, such that a thickness of the oxide film is reduced to a minimum thickness required to compensate for a roughness of the surface of the first substrate, such that the surface of the oxide film is at substantially the same elevation as the highest peak of the surface of the first substrate.

8. The method according to claim 7, wherein as the first substrate, any of sapphire, SiC and alumina is used.

9. The method according to claim 7, wherein as the second substrate, any of silicon, SiC, gallium nitride, SiGe and germanium is used.

10. The method according to claim 7, wherein before the laminating the first substrate and the second substrate, plasma processing or ozone processing is performed on the surface to be laminated of at least one of the first substrate and the second substrate.

11. The method according to claim 7,
wherein when the second substrate has the hardness of equal to or more than 150 GPa in Young's modulus, the method further comprising forming the oxide film on the surface of the second substrate, and then smoothing the oxide film,
wherein the laminating the first substrate and the second substrate includes laminating the surface of the first substrate and the surface of the second substrate, each surface to be laminated has a smoothed oxide film formed thereon.

12. A method of manufacturing a laminated substrate, comprising:
forming an oxide film on at least a surface of a first substrate having a hardness of equal to or more than 150 GPa in Young's modulus;
smoothing the oxide film by mechanically and chemically polishing a surface of the oxide film such that a surface roughness of the oxide film is equal to or less than 0.5 nm rms;
implanting hydrogen ions or rare gas ions, or mixed gas ions thereof from a surface of a second substrate to form an ion-implanted layer inside the substrate;
laminating the first substrate and the second substrate through at least the oxide film, and then detaching the second substrate in the ion-implanted layer by applying mechanical impacts to form a laminated substrate; and
heat-treating the laminated substrate and diffusing outwardly the oxide film, such that a thickness of the oxide film is reduced to a minimum thickness required to compensate for a roughness of the surface of the first substrate, such that the surface of the oxide film is at substantially the same elevation as the highest peak of the surface of the first substrate.

13. The method according to claim 12, wherein as the first substrate, any of sapphire, SiC and alumina is used.

14. The method according to claim 12, wherein as the second substrate, any of silicon, SiC, gallium nitride, SiGe and germanium is used.

15. The method according to claim 12, wherein before the laminating the first substrate and the second substrate, plasma processing or ozone processing is performed on the surface to be laminated of at least one of the first substrate and the second substrate.

16. The method according to claim 12,
wherein when the second substrate has the hardness of equal to or more than 150 GPa in Young's modulus, the method further comprising forming the oxide film on the surface of the second substrate, and then smoothing the oxide film,
wherein the laminating the first substrate and the second substrate includes laminating the surface of the first substrate and the surface of the second substrate, each surface to be laminated has a smoothed oxide film formed thereon.

* * * * *